(12) United States Patent
Huang

(10) Patent No.: US 10,586,751 B2
(45) Date of Patent: Mar. 10, 2020

(54) SEMICONDUCTOR PACKAGE DEVICE AND METHOD OF MANUFACTURING THE SAME

(71) Applicant: Advanced Semiconductor Engineering, Inc., Kaohsiung (TW)

(72) Inventor: Li-Chih Huang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/668,633

(22) Filed: Aug. 3, 2017

(65) Prior Publication Data

US 2019/0043780 A1 Feb. 7, 2019

(51) Int. Cl.
| | | |
|---|---|---|
| *H01L 23/28* | (2006.01) | |
| *H01L 23/367* | (2006.01) | |
| *H01L 23/31* | (2006.01) | |
| *H01L 29/06* | (2006.01) | |
| *H01L 21/56* | (2006.01) | |
| *H01L 21/683* | (2006.01) | |
| *H01L 23/00* | (2006.01) | |

(52) U.S. Cl.
CPC .......... *H01L 23/3677* (2013.01); *H01L 21/56* (2013.01); *H01L 21/561* (2013.01); *H01L 21/568* (2013.01); *H01L 21/6835* (2013.01); *H01L 23/3128* (2013.01); *H01L 23/3157* (2013.01); *H01L 23/367* (2013.01); *H01L 29/0665* (2013.01); *H01L 29/0676* (2013.01); *H01L 24/96* (2013.01); *H01L 2221/68372* (2013.01)

(58) Field of Classification Search
CPC . H01L 23/3677; H01L 29/0665; H01L 21/56; H01L 24/96
USPC ......................................... 257/618, 713, 778
See application file for complete search history.

(56) References Cited

U.S. PATENT DOCUMENTS

| | | | | |
|---|---|---|---|---|
| 5,990,546 A | * | 11/1999 | Igarashi | H01L 23/3121 257/700 |
| 6,334,856 B1 | * | 1/2002 | Allen | A61B 5/14514 128/898 |
| 6,791,197 B1 | * | 9/2004 | Katz | B28D 5/022 257/48 |
| 7,187,076 B2 | * | 3/2007 | Cuff | H01L 23/367 257/713 |
| 7,224,043 B2 | * | 5/2007 | Haeberlen | H01L 23/3142 257/622 |
| 7,939,916 B2 | * | 5/2011 | O'Donnell | H01L 21/561 257/659 |
| 9,349,670 B2 | * | 5/2016 | Zhou | H01L 23/3738 |
| 9,743,555 B2 | * | 8/2017 | Kim | H05K 7/20409 |

(Continued)

*Primary Examiner* — Nitin Parekh
(74) *Attorney, Agent, or Firm* — Foley & Lardner LLP

(57) ABSTRACT

A semiconductor package device comprises a substrate, an electrical component and a package body. The electrical component is disposed on the substrate. The electrical component has an active surface facing toward the substrate and a back surface opposite to the active surface. The back surface has a first portion and a second portion surrounding the first portion. The first portion of the back surface of the electrical component includes a plurality of pillars. The package body is disposed on the substrate. The package body encapsulates the electrical component and exposes the back surface of the electrical component.

22 Claims, 15 Drawing Sheets

(56) References Cited

U.S. PATENT DOCUMENTS

| | | | |
|---|---|---|---|
| 2005/0212145 A1* | 9/2005 | Imoto | H01L 23/3121 |
| | | | 257/782 |
| 2010/0006536 A1* | 1/2010 | Kalvesten | A61M 37/0015 |
| | | | 216/11 |
| 2014/0168902 A1* | 6/2014 | Park | H01L 23/367 |
| | | | 361/719 |
| 2016/0029517 A1* | 1/2016 | Kim | H05K 7/20409 |
| | | | 361/710 |
| 2017/0186681 A1* | 6/2017 | Pan | H01L 23/49838 |
| 2017/0299277 A1* | 10/2017 | Yang | F28D 15/046 |

* cited by examiner

SEMICONDUCTOR PACKAGE DEVICE AND METHOD OF MANUFACTURING THE SAME

BACKGROUND

1. Technical Field

The present disclosure relates generally to a semiconductor package device and a method of manufacturing the same. More particularly, the present disclosure relates to a semiconductor package device including a heat dissipation structure and a method of manufacturing the same.

2. Description of the Related Art

As electrical power consumption increases in electronic integrated circuits, it is challenging to keep operating temperature of a semiconductor device within an acceptable range. In general, a heat sink or spreader is bonded to the backside of the chip or die for heat dissipation. However, the use of the heat sink or spreader can increase the manufacturing cost and the thickness of the die or chip.

SUMMARY

In one or more embodiments, a semiconductor package device comprises a substrate, an electrical component and a package body. The electrical component is disposed on the substrate. The electrical component has an active surface facing toward the substrate and a back surface opposite to the active surface. The back surface has a first portion and a second portion surrounding the first portion. The first portion of the back surface of the electrical component includes a plurality of pillars. The package body is disposed on the substrate. The package body encapsulates the electrical component and exposes the back surface of the electrical component.

In one or more embodiments, a semiconductor package device comprises a substrate, an electrical component and a package body. The electrical component is disposed on the substrate. The electrical component has an active surface facing toward the substrate and a back surface opposite to the active surface. The back surface has a first portion and a second portion surrounding the first portion. The first portion of the back surface of the electrical component defines a plurality of holes. The package body is disposed on the substrate. The package body encapsulates the electrical component and exposes the back surface of the electrical component.

In one or more embodiments, a semiconductor package device comprises a substrate, an electrical component and a package body. The electrical component is disposed on the substrate. The electrical component has an active surface facing toward the substrate, a back surface opposite to the active surface and a lateral surface extending between the active surface and the back surface. The lateral surface of the electrical component defines a plurality of holes. The package body is disposed on the substrate. The package body encapsulates the electrical component and exposes the back surface and the plurality of holes of the lateral surface of the electrical component.

BRIEF DESCRIPTION OF THE DRAWINGS

Aspects of the present disclosure are best understood from the following detailed description when read with the accompanying drawings. It is noted that various features may not be drawn to scale, and the dimensions of the various features may be arbitrarily increased or reduced for clarity of discussion.

Common reference numerals are used throughout the drawings and the detailed description to indicate the same or similar elements. The present disclosure will be more apparent from the following detailed description taken in conjunction with the accompanying drawings.

DETAILED DESCRIPTION

According to at least some embodiments of the present disclosure, a semiconductor package device includes an electrical component (e.g., a die or a chip). A plurality of features in nanoscale (e.g., nanoscale pillars or holes) are disposed on a surface of the electrical component to improve heat dissipation of the semiconductor package device. The nanoscale features perform as heat dissipaters and replace a comparative heat sink, reducing manufacturing cost and an overall thickness of the semiconductor package device.

Figure 1A:
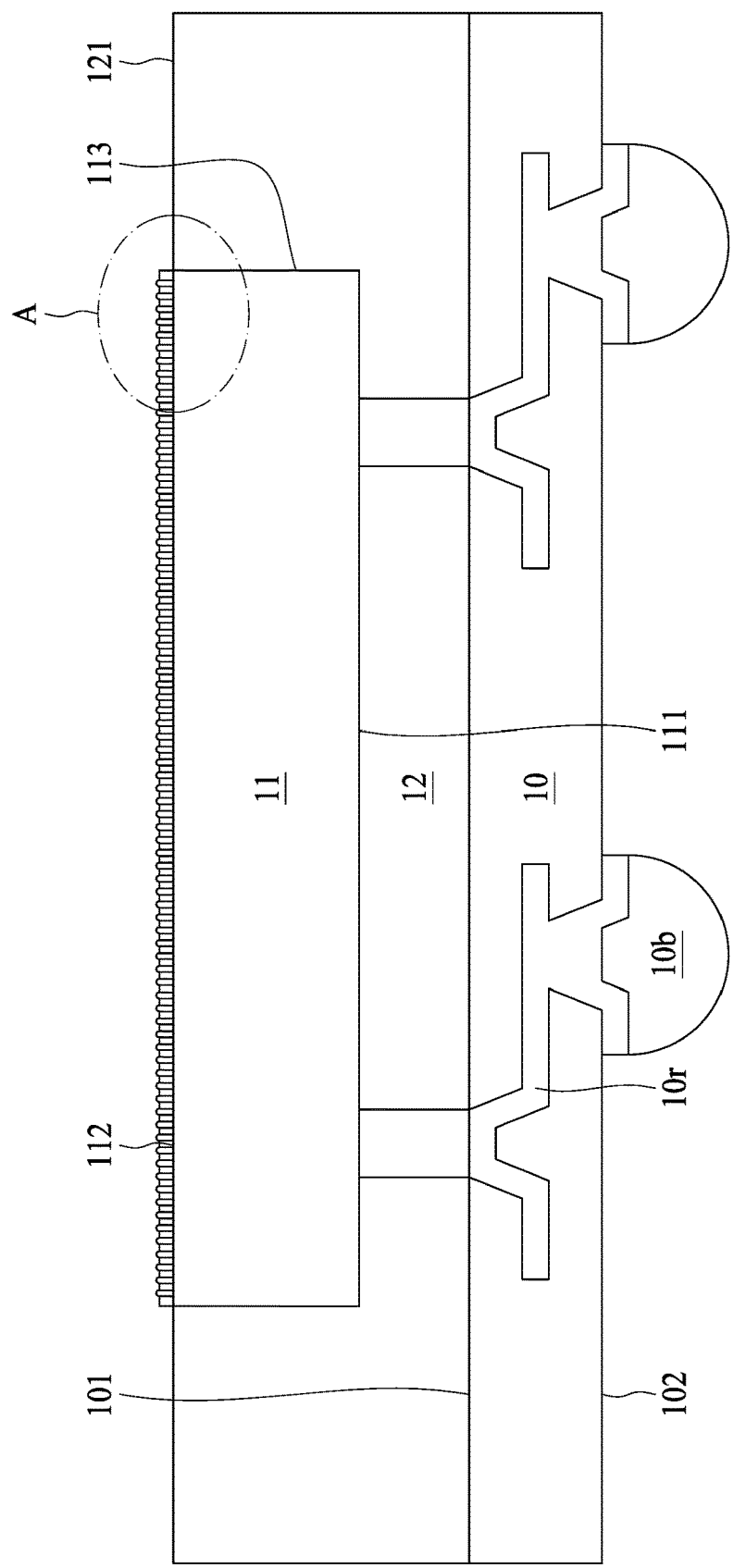
FIG. 1A illustrates a cross-sectional view of a semiconductor package device in accordance with some embodiments of the present disclosure.

FIG. 1A illustrates a cross-sectional view of a semiconductor package device 1A in accordance with some embodiments of the present disclosure. The semiconductor package device 1A includes a substrate 10, an electrical component (e.g., a die or a chip) 11 and a package body 12.

The substrate 10 may be, for example, a printed circuit board (PCB), such as a paper-based copper foil laminate, a composite copper foil laminate, a polymer-impregnated glass-fiber-based copper foil laminate, or a combination of two or more thereof. The substrate 10 may include an interconnection structure 10r, such as a redistribution layer (RDL). The substrate 10 has a top surface 101 (also referred to as "first surface") and a bottom surface 102 (also referred to as "second surface") opposite to the top surface 101. One or more electrical contacts 10b are disposed on the bottom surface 102 of the substrate 10 and electrically connected to the top surface 101 of the substrate 10 through the interconnection structure 10r. In some embodiments, the electrical contacts 10b are Controlled Collapse Chip Connection (C4) bumps, solder balls, Land Grid Array (LGA), or a combination of two or more thereof.

The electrical component 11 is disposed on the top surface 101 of the substrate 10. The electrical component 11 has an active surface 111 facing toward the top surface 101 of the substrate 10, a back surface 112 (also referred to as backside) opposite to the active surface 111 and a lateral surface 113 extending between the active surface 111 and the back surface 112. The electrical component 11 may include a semiconductor substrate, one or more integrated circuit devices and one or more overlying interconnection structures therein. The integrated circuit devices may include active devices such as transistors and/or passive devices such resistors, capacitors, inductors, or a combination of two or more thereof.

The package body 12 is disposed on the top surface 101 of the substrate 10 and covers the top surface 101 of the substrate 10 and a portion of the electrical component 11. The back surface 112 of the electrical component 11 is exposed from the package body 12. In some embodiments, a portion of the lateral surface 113 of the electrical component 11 is exposed from the package body 12. Alternatively, the lateral surface 113 of the electrical component 11 may be completely covered by the package body 12. In some embodiments, the package body 12 includes an epoxy resin having fillers, a molding compound (e.g., an epoxy molding compound or other molding compound), a polyimide, a phenolic compound or material, a material with a silicone dispersed therein, or a combination of two or more thereof.

Figure 1B:
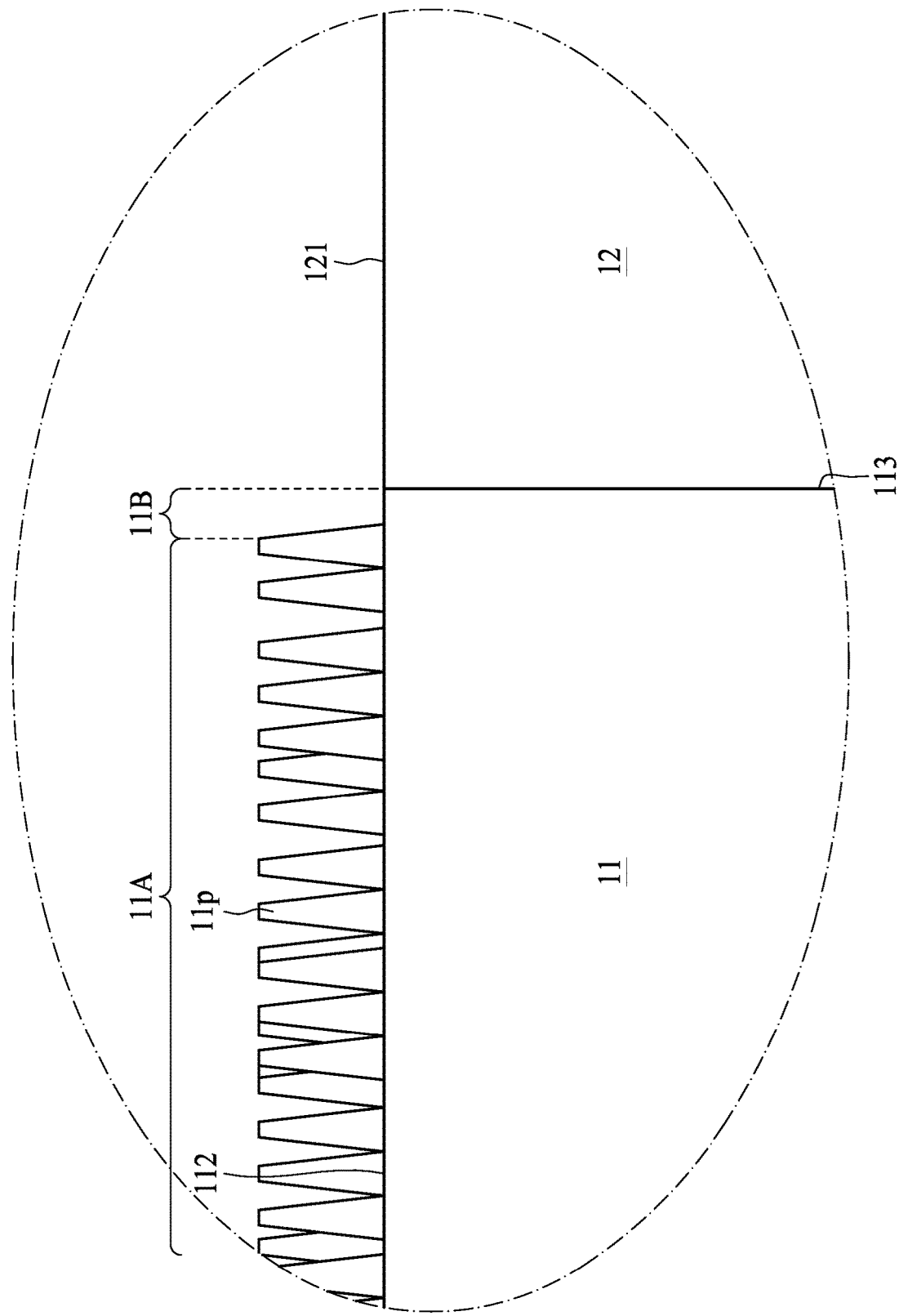
FIG. 1B illustrates an enlarged view of a portion of the semiconductor package device shown in FIG. 1A in accordance with some embodiments of the present disclosure.

FIG. 1B illustrates an enlarged view of a portion of the semiconductor package device 1 shown in FIG. 1A marked by the circle A, in accordance with some embodiments of the present disclosure.

The back surface 112 of the electrical component 11 has a first portion 11A and a second portion 11B surrounding the first portion 11A. In some embodiments, the first portion 11A may be a central portion of the back surface 112 of the electrical component 11 and the second portion 11B may be the edges of the back surface 112 of the electrical component 11.

As shown in FIG. 1B, the first portion 11A of the back surface 112 of the electrical component 11 includes a plurality of pillars 11p. In some embodiments, the pillars 11p are nanopillars. For example, either of, or both, the height and the width of each of the pillars 11p is in nanoscale. In some embodiments, the pillars 11p and the back surface 112 of the electrical component 11 are formed of the same material. For example, the pillars 11p are parts of the back surface 112 of the electrical component 11 and are integrally formed as a monolithic or homogeneous structure with a remaining part of the electrical component 11. In some embodiments, the heights of the pillars 11p are different from each other. In some embodiments, at least the highest portion of the pillars 11p is higher than an interface between the electrical component 11 and the package body 12. Pillars sized differently from the nanoscale are also encompassed by this disclosure, such as having heights and/or widths greater than 100 nanometers (nm) and up to 500 nm or greater.

In some embodiments, an interface between the electrical component 11 and the package body 12 is substantially coplanar with or lower than the second portion 11B of the back surface 112 of the electrical component 11 to avoid cracking at the edge of the top surface 112 of the electrical component 11. In some embodiments, the first portion 11A of the back surface 112 of the electrical component 11 is not coplanar with the second portion 11B of the back surface 112 of the electrical component 11. For example, the first portion 11A of the back surface 112 of the electrical component 11 can be higher than, substantially coplanar with or lower than an interface between the electrical component 11 and the package body 12 depending on various arrangements of different embodiments.

As shown in FIG. 1B, the top surface 121 of the package body 12 is substantially planar. In other embodiments, for example, as shown in FIG. 1E, the top surface 121' of the package body 12 may be arc-shaped.

By forming nanopillars 11p on the back surface 112 of the electrical component 11 that is exposed from the package body 12, the performance of the heat dispassion of the electrical component 11 can be improved. In addition, since no heat sink is included in the semiconductor package device 1, the manufacturing cost and the thickness of the semiconductor package device 1 can be reduced.

Figure 1C:
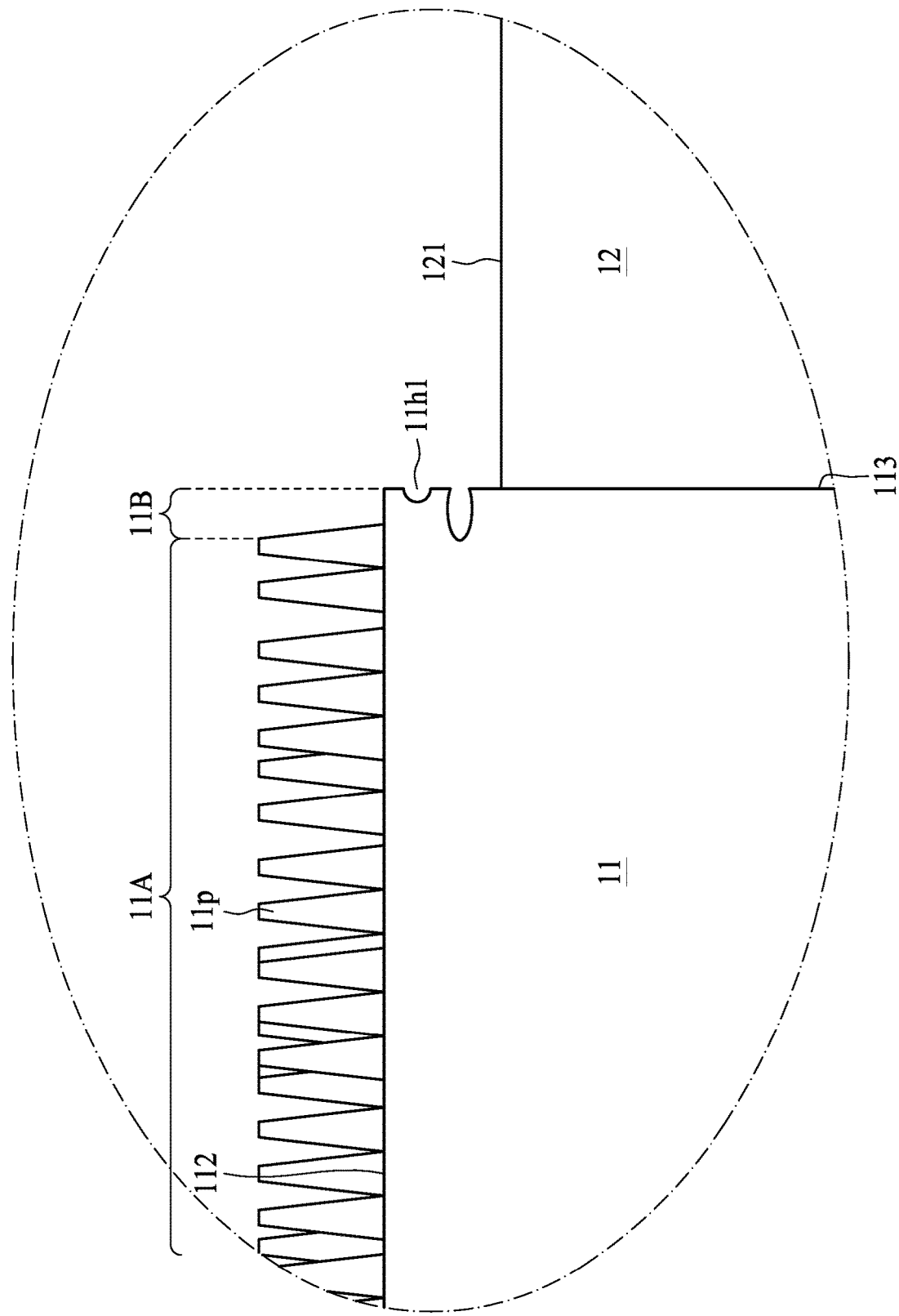
FIG. 1C illustrates an enlarged view of a portion of the semiconductor package device shown in FIG. 1A in accordance with some embodiments of the present disclosure.

FIG. 1C illustrates an enlarged view of a portion of the semiconductor package device 1 shown in FIG. 1A marked by the circle A, in accordance with some embodiments of the present disclosure.

As shown in FIG. 1C, the top surface 121 of the package body 12 is lower than the second portion 11B of the back surface 112 of the electrical component 11 to expose a portion of the lateral surface 113 of the electrical component 11. The exposed portion of the lateral surface 113 of the electrical component 11 defines a plurality of holes (or notches) 11h1. In some embodiments, the holes 11h1 are nanoholes. For example, either of, or both, the depth and the width of each of the holes 11h1 is in nanoscale. Holes sized differently from the nanoscale are also encompassed by this disclosure, such as having depths and/or widths greater than 100 nm and up to 500 nm or greater.

Figure 1D:
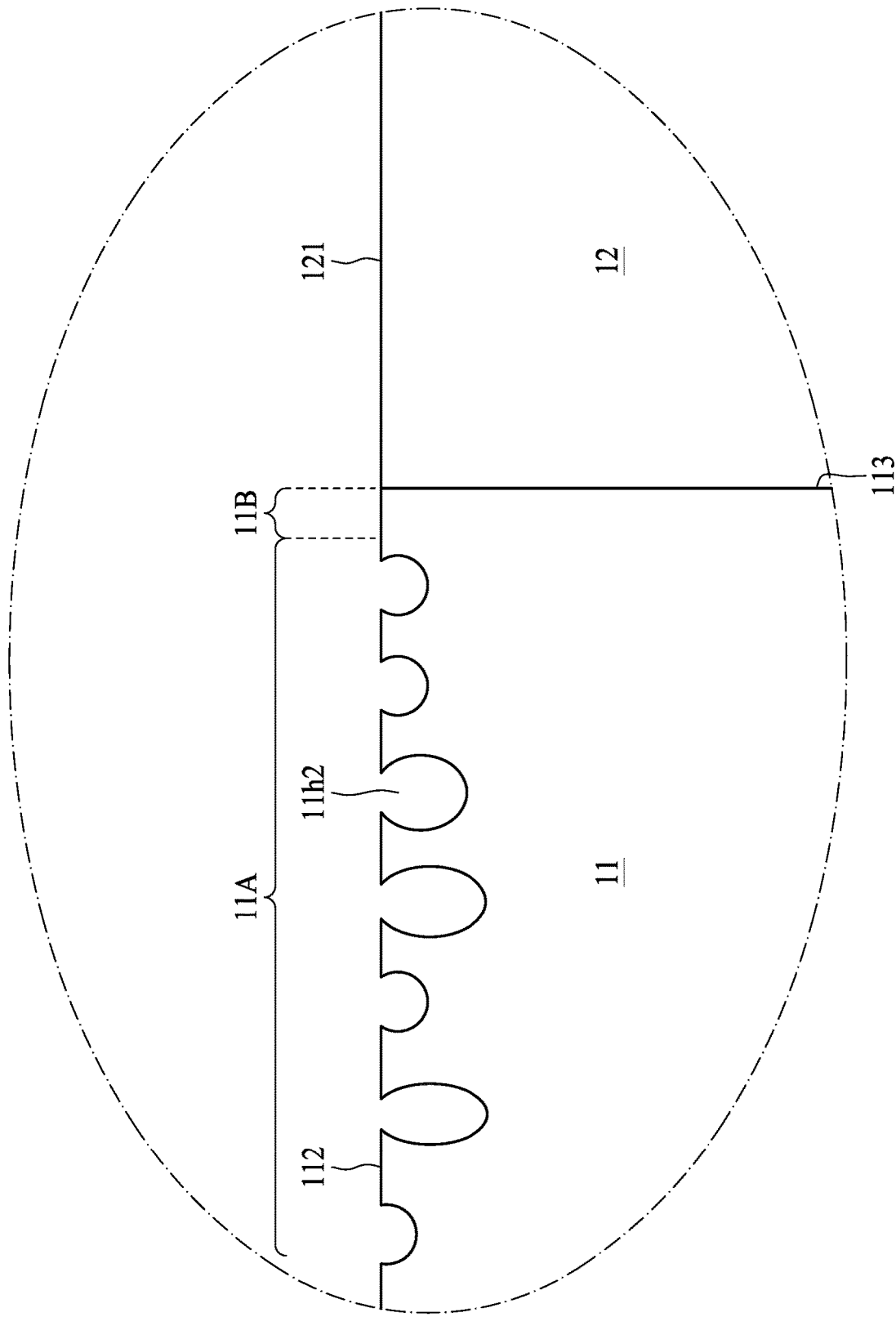
FIG. 1D illustrates an enlarged view of a portion of the semiconductor package device shown in FIG. 1A in accordance with some embodiments of the present disclosure.
Figure 1E:
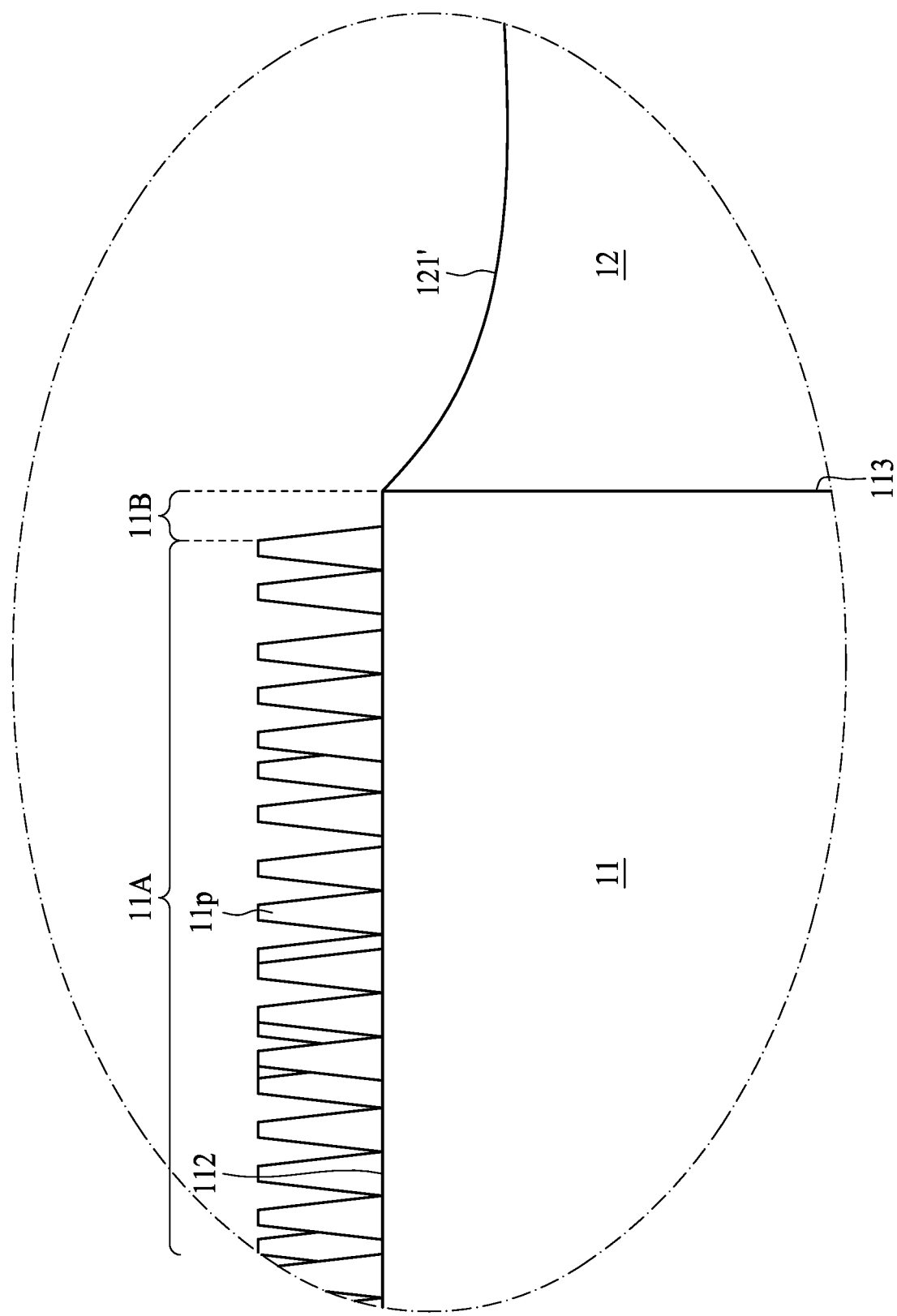
FIG. 1E illustrates an enlarged view of a portion of the semiconductor package device shown in FIG. 1A in accordance with some embodiments of the present disclosure.

FIG. 1D illustrates an enlarged view of a portion of the semiconductor package device 1 shown in FIG. 1A marked by the circle A, in accordance with some embodiments of the present disclosure. The structure shown in FIG. 1D is similar to that shown in FIG. 1B, except that in the structure shown in FIG. 1D, the first portion 11A of the back surface 112 of the electrical component 11 defines a plurality of holes (or notches) 11h2. In some embodiments, the holes 11h2 are nanoholes. For example, either of, or both, the depth and the width of each of the holes 11h2 is in nanoscale. In some embodiments, the depths or the widths of the holes 11h2 are different from each other.

By forming nanoholes 11h2 on the back surface 112 of the electrical component 11 that is exposed from the package body 12, the performance of the heat dispassion of the electrical component 11 can be improved. In addition, since no heat sink is included in the semiconductor package device 1, the manufacturing cost and the thickness of the semiconductor package device 1 can be reduced.

Figure 2A:
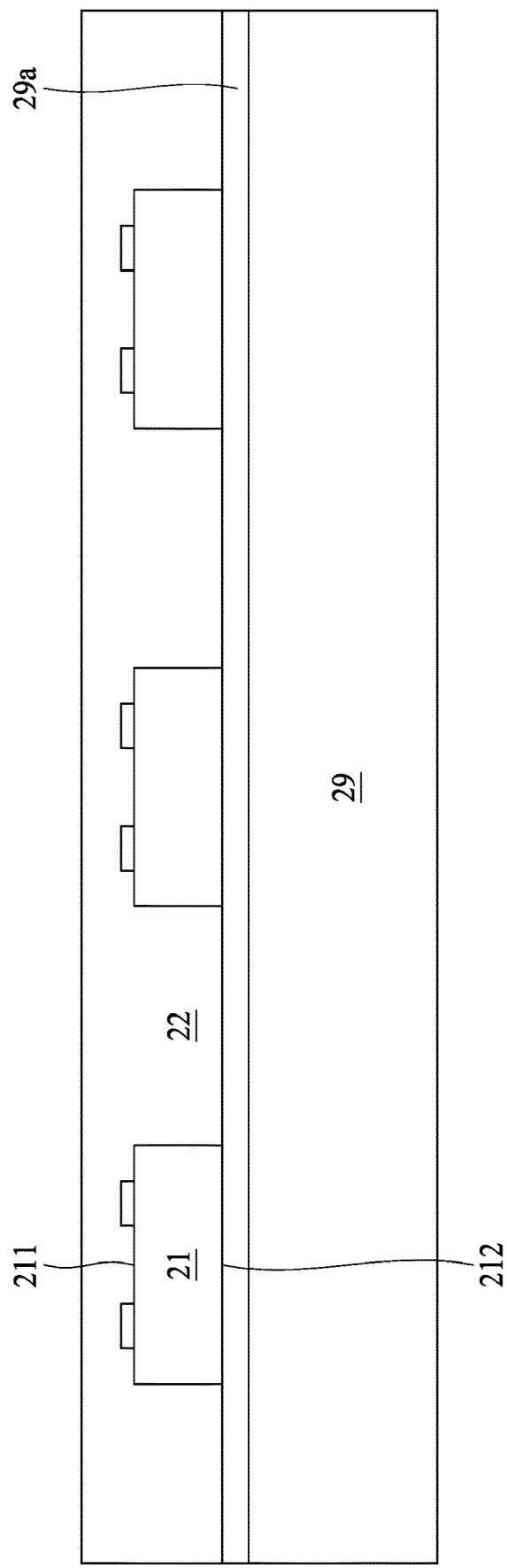
FIG. 2A illustrates one or more stages of a method of manufacturing a semiconductor package device in accordance with some embodiments of the present disclosure.
Figure 2B:
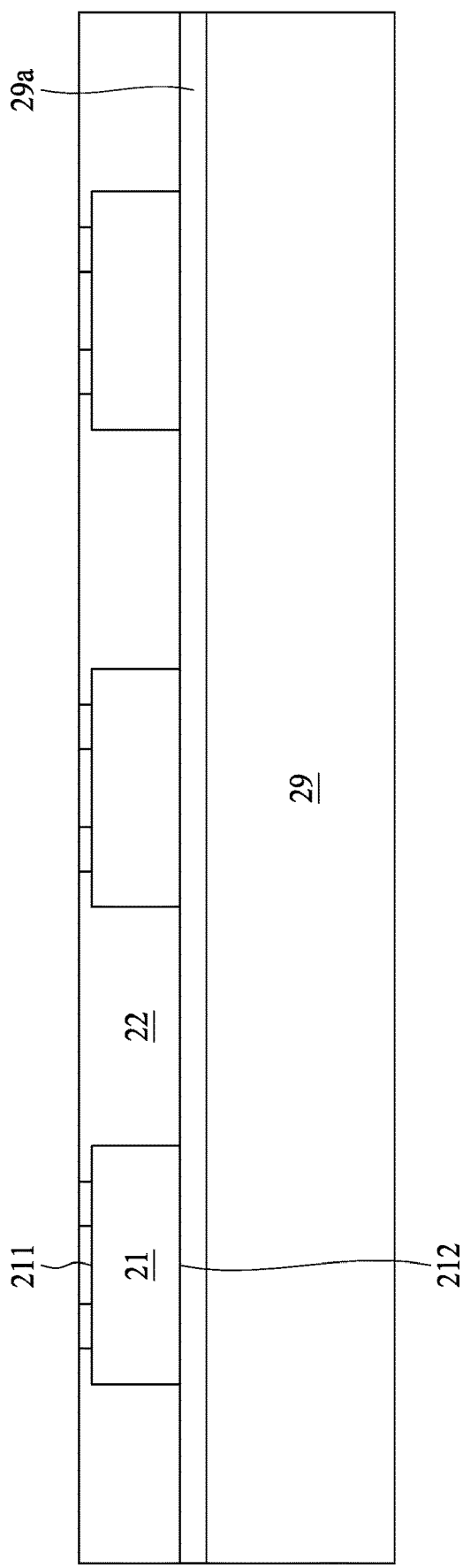
FIG. 2B illustrates one or more stages of a method of manufacturing a semiconductor package device in accordance with some embodiments of the present disclosure.
Figure 2C:
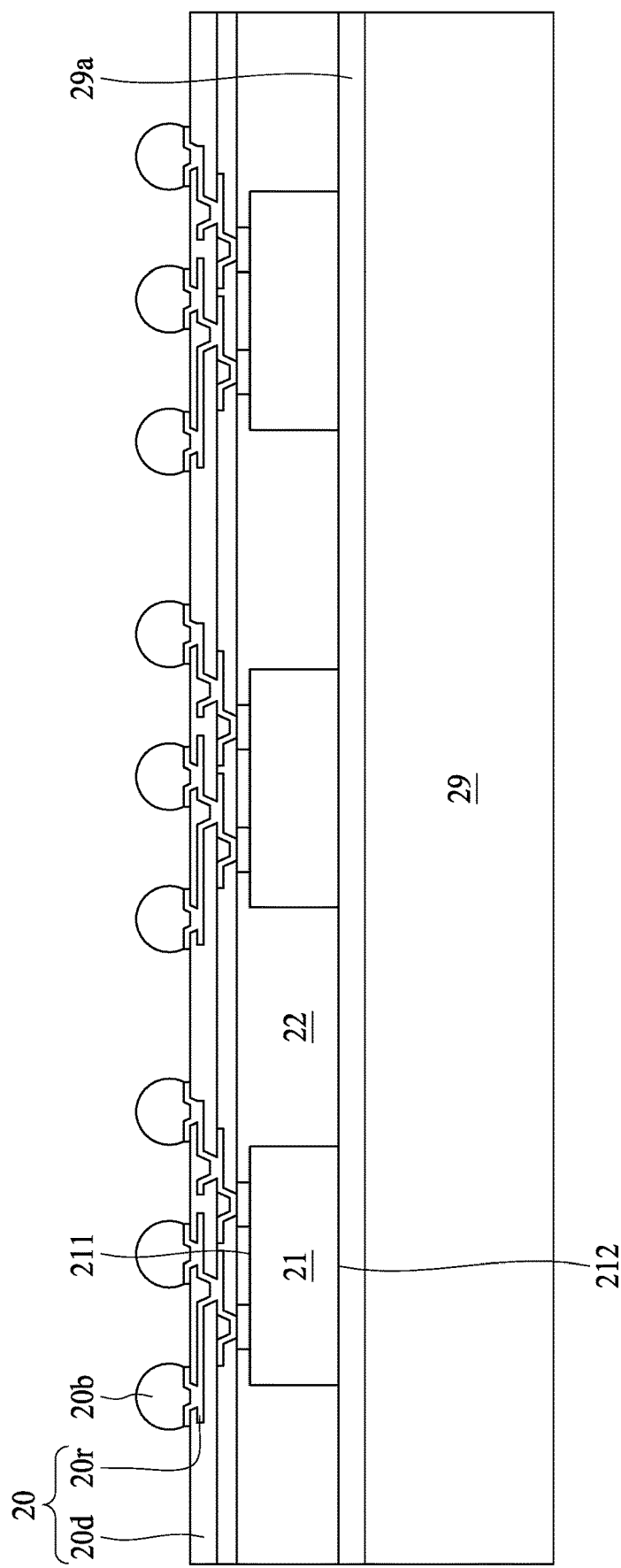
FIG. 2C illustrates one or more stages of a method of manufacturing a semiconductor package device in accordance with some embodiments of the present disclosure.
Figure 2C:
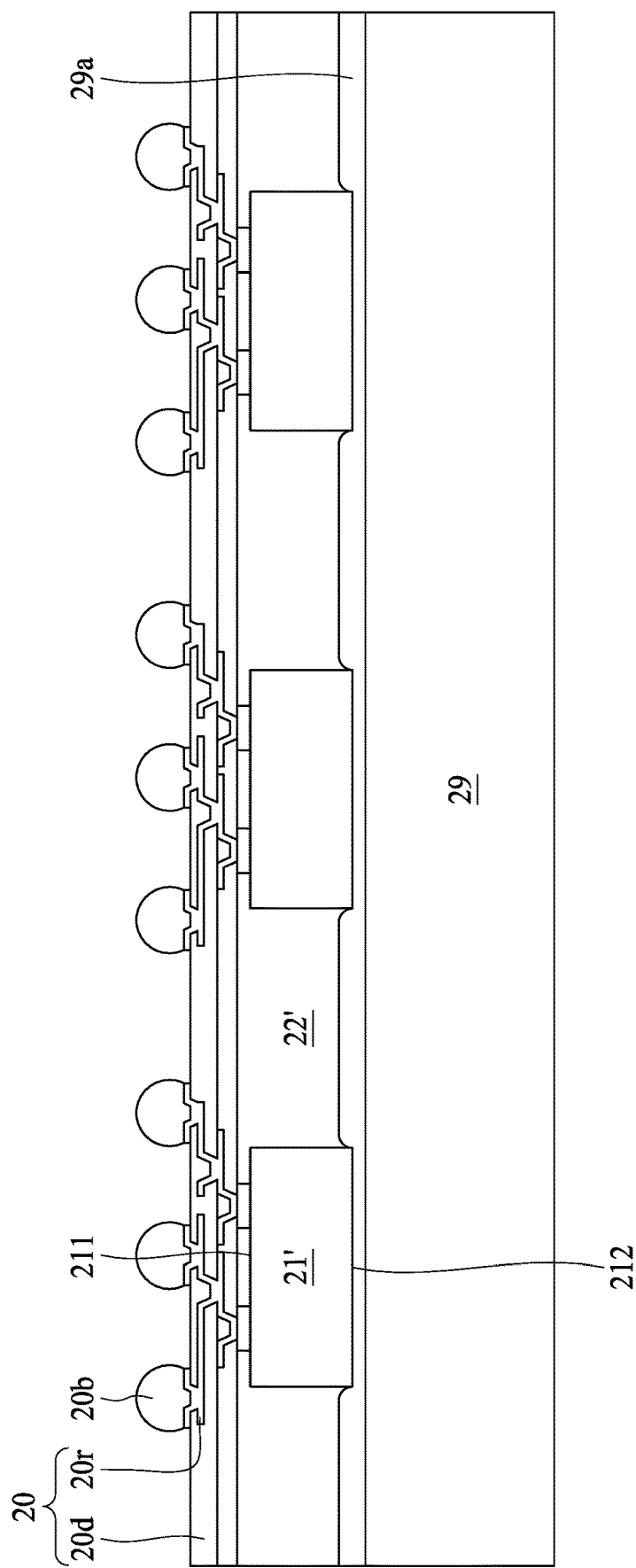

FIGS. 2A, 2B, 2C, 2C', 2D and 2D' are cross-sectional views of a semiconductor structure fabricated at various stages, in accordance with some embodiments of the present disclosure. Various figures have been simplified for a better understanding of the aspects of the present disclosure.

Referring to FIG. 2A, a carrier 29 with an adhesive 29a (e.g., a tape) thereon is provided. A plurality of electrical components 21 are attached to the carrier 29 through the adhesive 29a to facilitate the subsequent processes. The electrical component 21 has an active surface 211 and a back surface 212 (also referred to as backside) facing toward the carrier 29. For example, the back surface 212 of the electrical component 21 is attached to the carrier 29.

A package body 22 is then formed on the carrier 29 to cover the electrical components 21. In some embodiments, the package body 22 includes an epoxy resin having fillers, a molding compound (e.g., an epoxy molding compound or other molding compound), a polyimide, a phenolic compound or material, a material with a silicone dispersed therein, or a combination of two or more thereof.

Referring to FIG. 2B, a portion of the package body 22 is removed to expose conductive pads on the active surface 211 of the electrical component 21. In some embodiments, the package body 22 can be removed by, e.g., grinding, etching or other suitable processes.

Referring to FIG. 2C, a circuit layer 20 or redistribution layer (RDL) is formed on the package body 22 and electrically connected with the conductive pads on the active surface 211 of the electrical component 21. The circuit layer 20 includes a dielectric layer or an insulation layer 20d and conductive layers 20r (e.g., a metal layer) encapsulated or covered by the dielectric layer 20d. In some embodiments, the circuit layer 20 may be formed by the following operations: (i) forming a photoresist or mask on the package body 22; (ii) defining a predetermined pattern on the photoresist or mask by, for example, lithographic technique; (iii) plating conductive material to form the patterned conductive layers 20r; and (iv) removing the photoresist or mask.

Electrical contacts 20b are then formed on the conductive layers 20r. In some embodiments, the electrical contacts 20b are C4 bumps, BGA, LGA or a combination of two or more thereof. In some embodiments, the electrical contacts 20b can be formed by, e.g., electroplating, electroless plating, sputtering, paste printing, bumping or bonding process.

As shown in FIG. 2C, the back surface 212 of the electrical component 21 is substantially coplanar with a surface of the package body 22. In some embodiments, as shown in FIG. 2C', the electrical component 21' may sink into the adhesive 29a, and thus the back surface 212 of the electrical component 21' is not coplanar with the surface of the package body 22'.

Figure 2D:
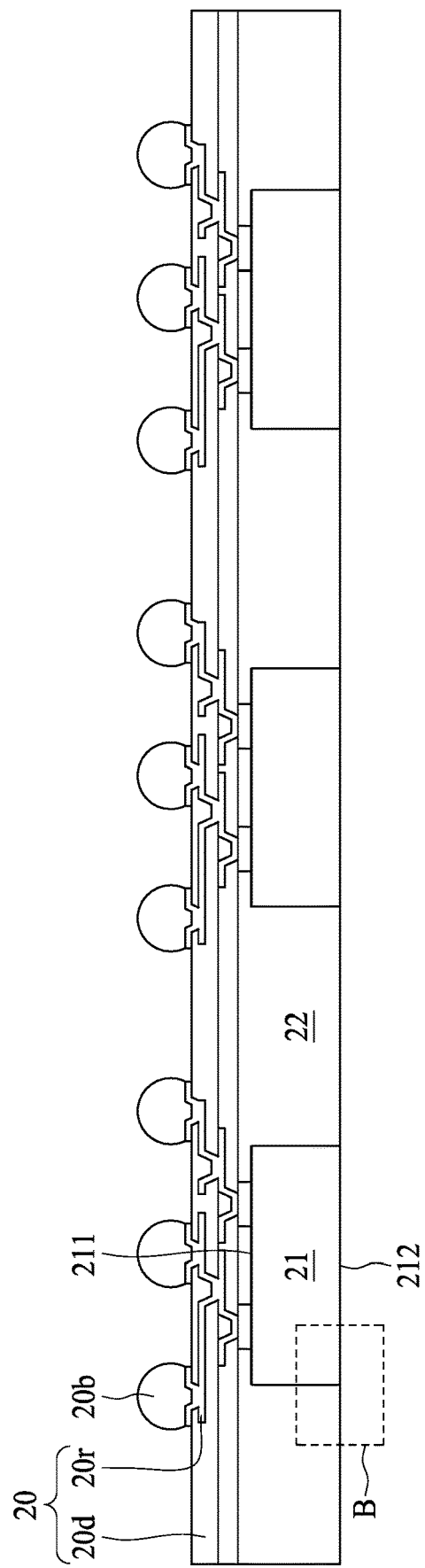
FIG. 2D illustrates one or more stages of a method of manufacturing a semiconductor package device in accordance with some embodiments of the present disclosure.
Figure 2D:
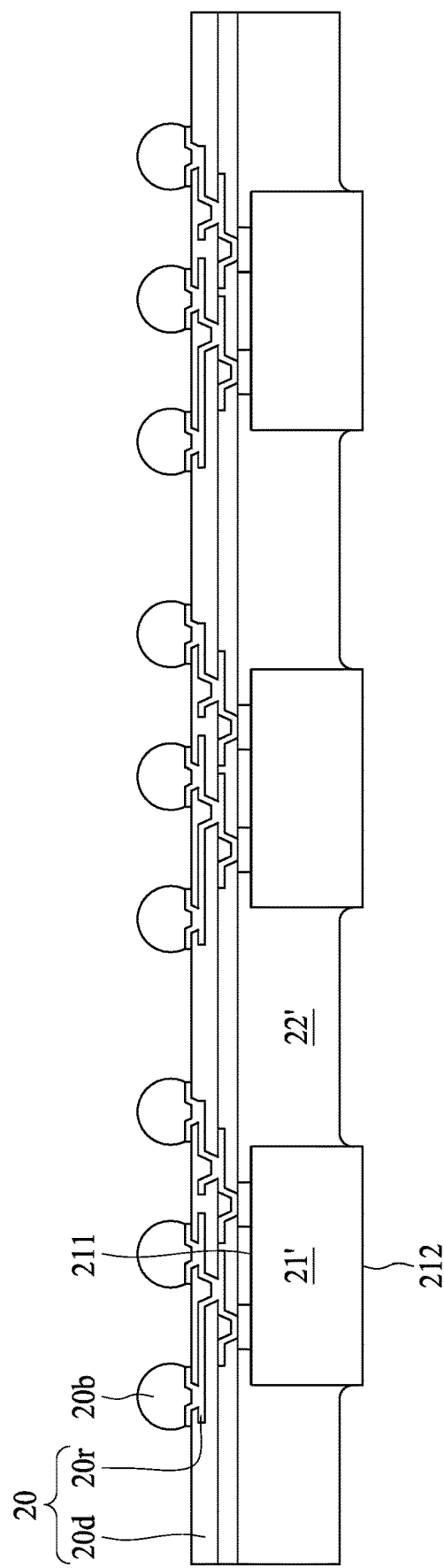

Referring to FIG. 2D, the carrier 29 together with the adhesive 29h are removed from the package body 22 to expose the back surface 212 of the electrical component 21. A singulation process may be performed to separate the structure shown in FIG. 2D into individual semiconductor package devices. In some embodiments, the singulation process may be performed by sawing, laser or other suitable processes.

The operation shown in FIG. 2D' is similar to the operation shown in FIG. 2D, except that the operation shown in FIG. 2D' is carried out subsequent to the operation shown in FIG. 2C' (the electrical component 21' sinks into the adhesive 29a) while the operation shown in FIG. 2D is carried out subsequent to the operation shown in FIG. 2C.

Figure 3B:
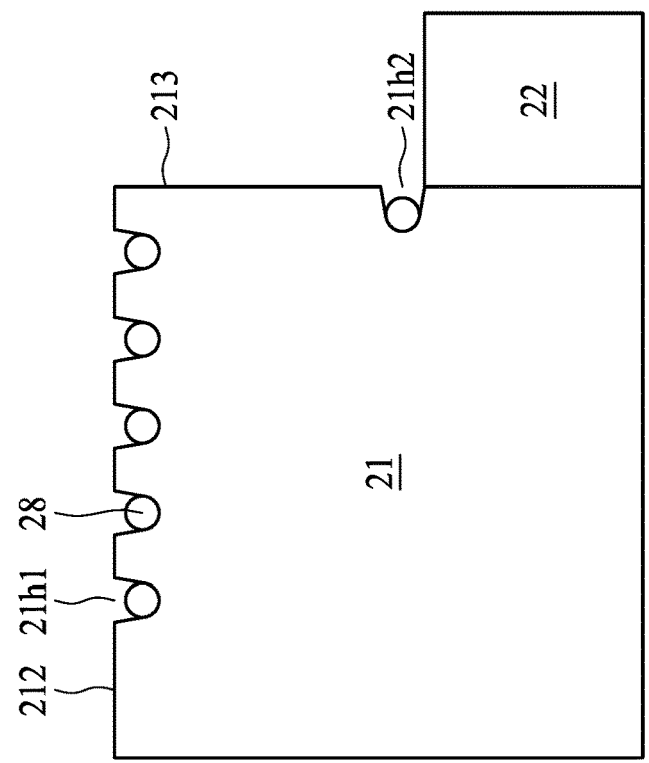
FIG. 3B illustrates one or more stages of a method of manufacturing a semiconductor package device in accordance with some embodiments of the present disclosure.
Figure 3A:
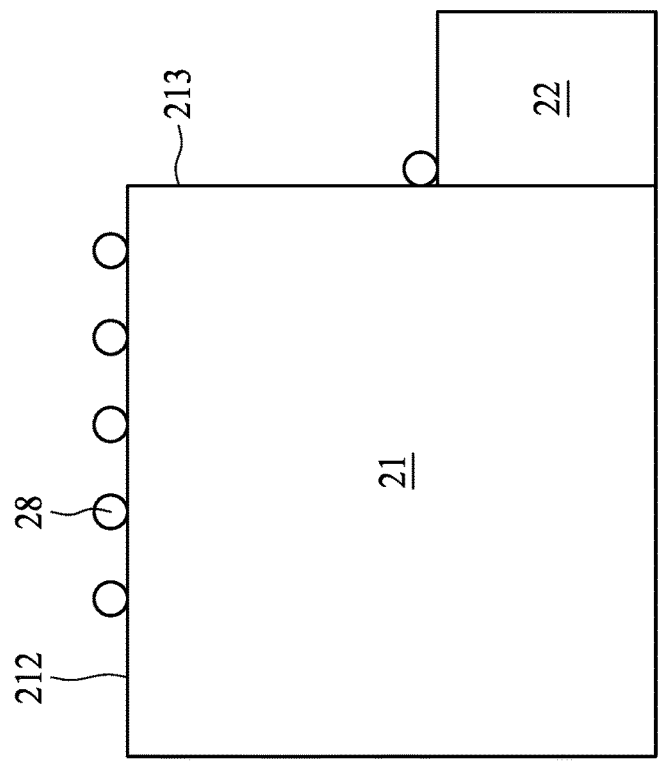
FIG. 3A illustrates one or more stages of a method of manufacturing a semiconductor package device in accordance with some embodiments of the present disclosure.
Figure 3C:
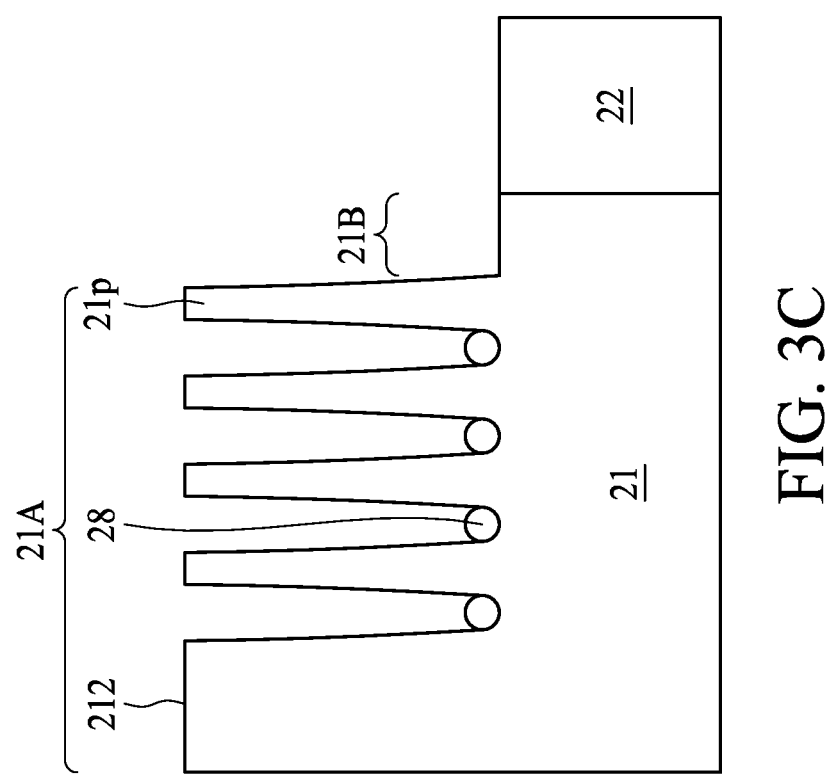
FIG. 3C illustrates one or more stages of a method of manufacturing a semiconductor package device in accordance with some embodiments of the present disclosure.

FIGS. 3A, 3B and 3C are cross-sectional views of an enlarged portion of the semiconductor structure (marked by the square B in FIG. 2D) fabricated at various stages after the operations shown in FIG. 2D, in accordance with some embodiments of the present disclosure. Various figures have been simplified for a better understanding of the aspects of the present disclosure.

Referring to FIG. 3A, a plurality of particles containing silver ions (e.g., silver ions $Ag^+$ of $AgNO_3$) 28 are applied on the back surface 212 of the electrical component 21. In some embodiments, the particles containing silver ions ($Ag^+$) 28 may be applied on a portion of the lateral surface 213 of the electrical component 21 that is exposed from the package body 22.

Referring to FIG. 3B, a reduction-oxidation reaction (Redox) is then performed on the back surface 212 of the electrical component 21 that is made of, e.g., silicon (Si). For example, the back surface 212 of the electrical component 21 is oxidized to form silicon dioxide ($SiO_2$) at some locations on the back surface 212 and/or the lateral surface 213. Then, hydrofluoric acid (HF) is applied on the back surface 212 of the electrical component 21 to remove $SiO_2$ to form a plurality of holes 21h1, 21h2 on the back surface 212 and the lateral surface 213 of the electrical component 21.

Figure 4A:
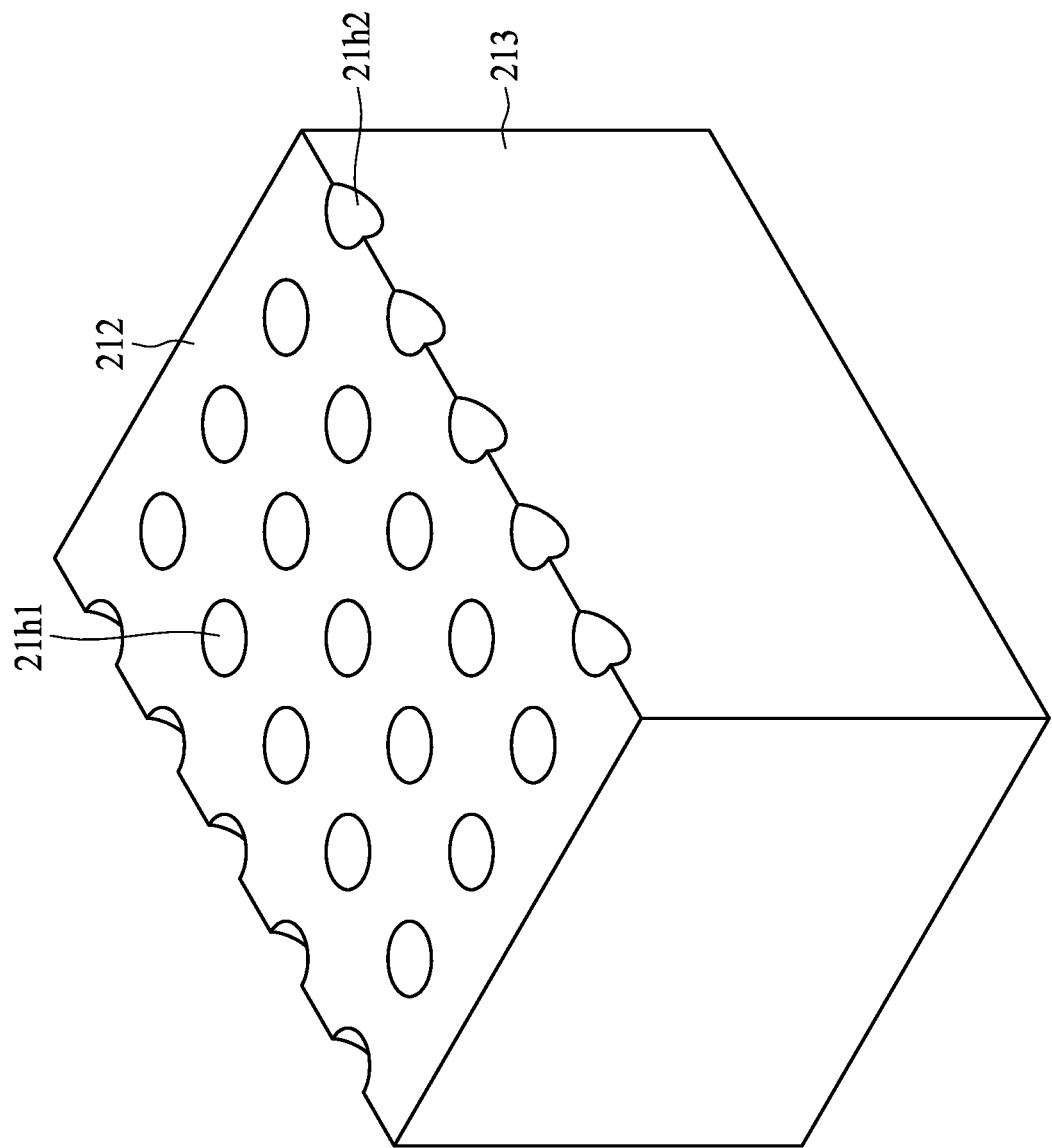
FIG. 4A illustrates a perspective view of a portion of an electrical component in accordance with some embodiments of the present disclosure.

If the etching process is terminated during the process of applying hydrofluoric acid or the concentration of $Ag^+$ is insufficient, the back surface 212 of the electrical component 21 may be at a status as shown in FIG. 4A, which illustrates a perspective view of a portion of the electrical component 21. As shown in FIG. 4A, the back surface 212 and the lateral surface 213 of the electrical component 21 define a plurality of holes 21h1, 21h2. In some embodiments, the structure shown in FIG. 4A is similar to that shown in FIG. 1D, except that the lateral surface 113 of the electrical component 11 shown in FIG. 1D does not define holes.

Figure 4B:
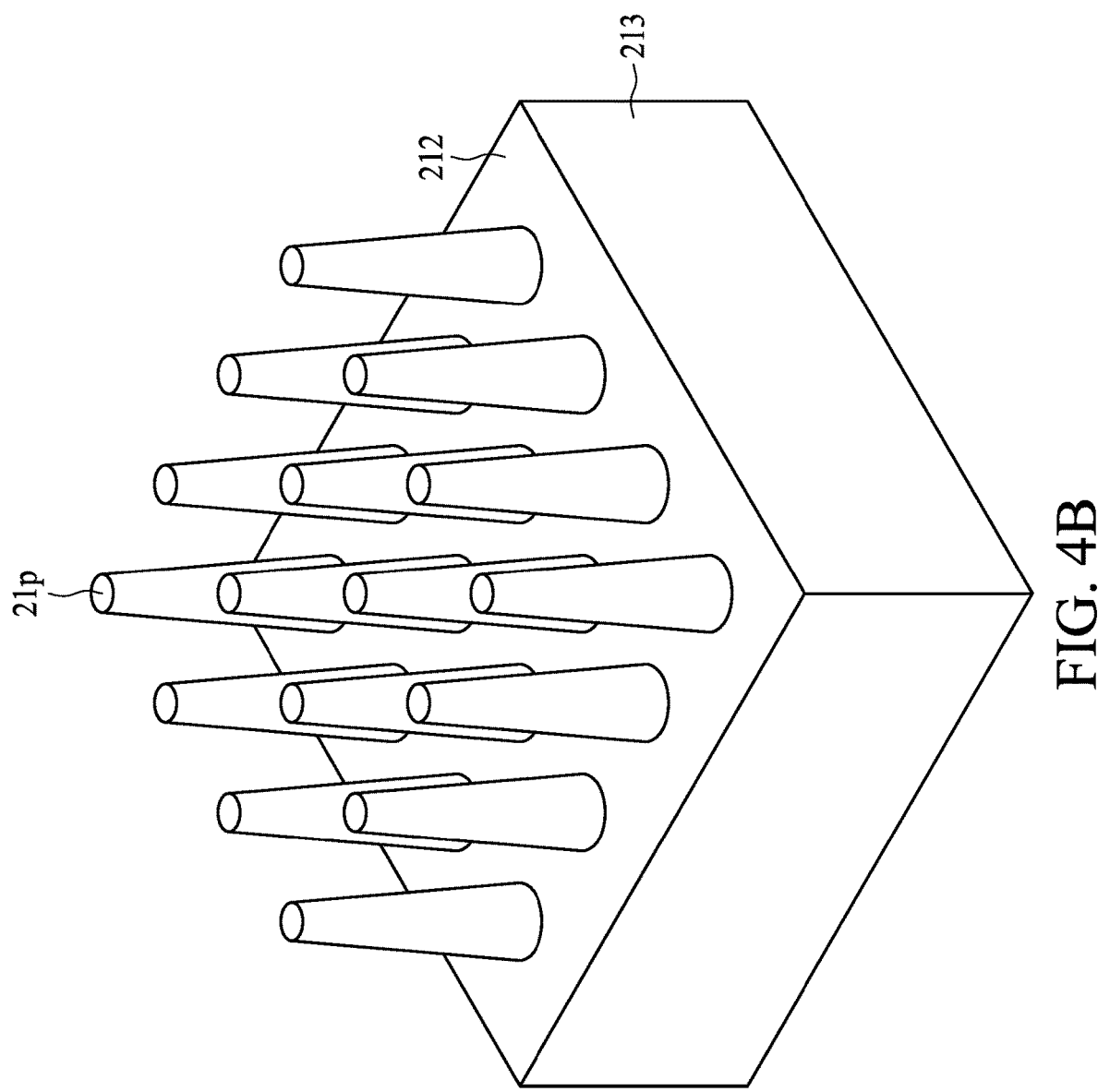
FIG. 4B illustrates a perspective view of a portion of an electrical component in accordance with some embodiments of the present disclosure.

Referring to FIG. 3C, if the etching process keeps proceeding or the concentration of $Ag^+$ increases (e.g., by applying $Fe(NO_3)_3$ or $H_2O_2$ as oxidizer), the back surface 212 of the electrical component 21 may be at a status as shown in FIG. 4B, which illustrates a perspective view of a portion of the electrical component 21. As shown in FIG. 4B, the back surface 212 of the electrical component 21 includes a plurality of pillars 21p. In some embodiments, the structure shown in FIG. 4B is similar to that shown in FIG. 1B. In some embodiments, some pillars 21p adjacent to the second portion (e.g., edge portion) 21B of the back surface 212 of the electrical component 21 may be removed due to the etching process performed on the lateral surface 213 of the electrical component 21. Therefore, most of the pillars 21p are located at the first portion (e.g., central portion) 21A of the back surface 212 of the electrical component 21.

In some embodiments, the operations shown in FIGS. 3A-3C may be performed by dipping the back surface 212 of the electrical component 21 into a solution mixed with $AgNO_3$ and HF under a temperature in a range from about 60 degrees to about 800 degrees for about 1-5 minutes. The choice of operation temperature and/or operation time period may depend on which final structure (the structure in FIG. 4A or FIG. 4B) is desired or specified.

As used herein, a dimension of an object being in "nanoscale" or "nanoscopic scale" means the dimension of the object is from 1 nanometer (nm) to 100 nm, such as from 1 nm to 50 nm, or from 1 nm to 10 nm.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor package device, comprising:
   a substrate;
   an electrical component on the substrate, the electrical component having an active surface facing the substrate and a back surface opposite to the active surface, the back surface having a first portion and a second portion surrounding the first portion, wherein the first portion of the back surface of the electrical component includes a plurality of pillars; and
   a package body on the substrate, the package body encapsulating the electrical component and exposing the back surface of the electrical component, and defining an interface with the electrical component,
   wherein a top surface of the package body is substantially planar.

2. The semiconductor package device of claim 1, wherein the interface between the electrical component and the package body is substantially coplanar with or lower than the second portion of the back surface of the electrical component.

3. The semiconductor package device of claim 1, wherein a highest portion of the first portion of the back surface of the electrical component is higher than the interface between the electrical component and the package body.

4. The semiconductor package device of claim 1, wherein the plurality of pillars are nanopillars.

5. The semiconductor package device of claim 1, wherein the electrical component further comprises a lateral surface extending between the active surface and the back surface, and the lateral surface defines a plurality of holes.

6. The semiconductor package device of claim 5, wherein depths or widths of the holes are in nanoscale.

7. The semiconductor package device of claim 1, wherein the pillars of the plurality of pillars have respective heights in a range of 100 nanometers (nm) to 500 nm.

8. The semiconductor package device of claim 1, wherein a highest portion of the pillars is higher than an interface between the electrical component and the package body.

9. The semiconductor package device of claim 1, wherein the pillars are included in the electrical component.

10. A semiconductor package device, comprising:
    a substrate;
    an electrical component on the substrate, the electrical component having an active surface facing the substrate and a back surface opposite to the active surface, the back surface having a first portion and a second portion surrounding the first portion, wherein the first portion of the back surface of the electrical component defines a plurality of holes; and a package body on the substrate, the package body encapsulating the electrical component and exposing the back surface of the electrical component, and having a top surface that is substantially planar.

11. The semiconductor package device of claim 10, wherein an interface between the electrical component and the package body is substantially coplanar with or lower than the second portion of the back surface of the electrical component.

12. The semiconductor package device of claim 10, wherein a lowest portion of the first portion of the back surface of the electrical component is lower than an interface between the electrical component and the package body.

13. The semiconductor package device of claim 10, wherein depths or widths of the plurality of holes are in nanoscale.

14. The semiconductor package device of claim 10, wherein the electrical component further comprises a lateral surface extending between the active surface and the back surface, and the lateral surface defines a plurality of holes.

15. A semiconductor package device, comprising:

a substrate;

an electrical component on the substrate, the electrical component having an active surface facing the substrate, a back surface opposite to the active surface and a lateral surface extending between the active surface and the back surface, wherein the lateral surface of the electrical component defines a plurality of holes; and a package body on the substrate, the package body encapsulating the electrical component and exposing the back surface and the plurality of holes of the lateral surface of the electrical component, wherein a top surface of the package body is substantially planar.

16. The semiconductor package device of claim 15, wherein the back surface has a first portion and a second portion surrounding the first portion, and the first portion of the back surface of the electrical component defines a plurality of holes.

17. The semiconductor package device of claim 15, wherein depths or widths of the plurality of holes are in nanoscale.

18. The semiconductor package device of claim 15, wherein the back surface has a first portion and a second portion surrounding the first portion, and the first portion of the back surface of the electrical component includes a plurality of pillars.

19. The semiconductor package device of claim 18, wherein the plurality of pillars are nanopillars.

20. The semiconductor package device of claim 15, wherein the back surface has a first portion and a second portion surrounding the first portion and an interface between the electrical component and the package body is substantially coplanar with or lower than the second portion of the back surface of the electrical component.

21. The semiconductor package device of claim 15, wherein the back surface has a first portion and a second portion surrounding the first portion and a lowest portion of the first portion of the back surface of the electrical component is lower than an interface between the electrical component and the package body.

22. The semiconductor package device of claim 15, wherein the package body has an arc surface surrounding the lateral surface of the electrical component.

* * * * *